(12) United States Patent
Yoon et al.

(10) Patent No.: US 11,730,037 B2
(45) Date of Patent: Aug. 15, 2023

(54) DISPLAY DEVICE

(71) Applicant: Samsung Display Co., Ltd., Yongin-Si (KR)

(72) Inventors: Seon-Tae Yoon, Hwaseong-si (KR); Junghyun Kwon, Yongin-si (KR); Hyojoon Kim, Suwon-si (KR); Yunha Ryu, Hwaseong-si (KR); Kisoo Park, Hwaseong-si (KR); Hyeseung Lee, Seoul (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 294 days.

(21) Appl. No.: 17/225,373

(22) Filed: Apr. 8, 2021

(65) Prior Publication Data

US 2021/0391390 A1 Dec. 16, 2021

(30) Foreign Application Priority Data

Jun. 12, 2020 (KR) ........................ 10-2020-0071856

(51) Int. Cl.
*H10K 59/38* (2023.01)
*H10K 50/854* (2023.01)
(Continued)

(52) U.S. Cl.
CPC ........... *H10K 59/38* (2023.02); *H10K 50/854* (2023.02); *H10K 50/858* (2023.02); *H01L 25/0753* (2013.01)

(58) Field of Classification Search
CPC .. H01L 25/0753; H10K 59/122; H10K 59/30; H10K 59/50; H10K 59/38; H10K 50/115;
(Continued)

(56) References Cited

U.S. PATENT DOCUMENTS 10,048,412 B2 8/2018 Li
10,678,091 B2 6/2020 Lee et al.
(Continued)

FOREIGN PATENT DOCUMENTS

EP 3543774 A1 9/2019
EP 3570328 A1 11/2019
(Continued)

OTHER PUBLICATIONS

Extended European Search Report for Application No. 21178970.6-1212 dated Nov. 11, 2021.

*Primary Examiner* — Anne M Hines
*Assistant Examiner* — Jose M Diaz
(74) *Attorney, Agent, or Firm* — Cantor Colburn LLP

(57) ABSTRACT

A display device includes a display panel, a wavelength control layer disposed on the display panel, a light control member disposed on the wavelength control layer, and a cover layer disposed on the light control member. The light control member includes an inorganic layer disposed on the wavelength control layer and having a first refractive index, a first light control layer disposed on the inorganic layer and having a second refractive index, a second light control layer disposed on the first light control layer and having a third refractive index, and a color filter layer disposed on the second light control layer. The first refractive index is greater than the second refractive index and is less than a refractive index of the wavelength control layer, and the third refractive index is greater than the second refractive index and is less than a refractive index of the color filter layer.

20 Claims, 8 Drawing Sheets

(51) Int. Cl.
*H10K 50/858* (2023.01)
*H01L 25/075* (2006.01)

(58) Field of Classification Search
CPC .... H10K 50/854; H10K 50/858; H10K 50/86; H10K 50/85; H10K 2102/331; H10K 2102/351; G02B 5/201; G02B 5/206
See application file for complete search history.

(56) References Cited

U.S. PATENT DOCUMENTS

2016/0154143 A1* 6/2016 Furusato ............... G04B 39/00
 359/581
2020/0135811 A1 4/2020 Jung et al.

FOREIGN PATENT DOCUMENTS

| EP | 3588600 A1 | 1/2020 |
| JP | 2017037121 A | 2/2017 |
| KR | 1020190047592 A | 5/2019 |

* cited by examiner

DISPLAY DEVICE

This application claims priority to Korean Patent Application No. 10-2020-0071856, filed on Jun. 12, 2020, and all the benefits accruing therefrom under 35 U.S.C. § 119, the content of which in its entirety is herein incorporated by reference.

BACKGROUND

1. Field

The disclosure herein relates to a display device, and more particularly, to a display device with improved reliability.

2. Description of the Related Art

Various display devices used for multimedia devices such as televisions, mobile phones, tablet computers, and game consoles are being developed. The display device may include different types of wavelength control layers according to pixels to generate a color image. The wavelength control layer may transmit a portion of the wavelength range of the source light or convert the wavelength range of the source light.

Such a display device may include various optical functional layers to provide users with improved quality color images, and research is being conducted to reduce external light reflectance.

SUMMARY

The disclosure provides a display device having a reduced external light reflectance.

An embodiment of the invention provides a display device including: a display panel; a wavelength control layer disposed on the display panel; a light control member disposed on the wavelength control layer; and a cover layer disposed on the light control member, where the light control member includes: an inorganic layer disposed on the wavelength control layer and having a first refractive index; a first light control layer disposed on the inorganic layer and having a second refractive index; a second light control layer disposed on the first light control layer and having a third refractive index; and a color filter layer disposed on the second light control layer. In such an embodiment, the first refractive index is greater than the second refractive index and is less than a refractive index of the wavelength control layer, wherein the third refractive index is greater than the second refractive index and is less than a refractive index of the color filter layer.

In an embodiment, each of the first refractive index and the third refractive index may be in a range of about 1.4 to about 1.5.

In an embodiment, a thickness of the inorganic layer may be in a range of about 2.5 kiloangstrom (kÅ) to about 3.5 kÅ.

In an embodiment, a thickness of the second light control layer may be in a range of about 0.5 kA to about 1.5 kA and about 2.5 kA to about 3.5 kÅ.

In an embodiment, the second light control layer may include an inorganic film or an organic film.

In an embodiment, the second light control layer may include an optically transparent organic film.

In an embodiment, the second light control layer may include an organic film, in which a light transmittance in a yellow light wavelength range is less than a light transmittance in a blue light wavelength range.

In an embodiment, the second refractive index may be about 1.3 or less.

In an embodiment, the display panel may include a pixel area and a peripheral area adjacent to the pixel area, and the display panel may include a light emitting element which generates first light and is disposed in the pixel area. In such an embodiment, the wavelength control layer may include: a partition part in which a plurality of opening parts are defined; a first wavelength control unit disposed on one of the opening parts, where the first wavelength control unit may convert the first light into a second light; and a second wavelength control unit disposed on another of the opening parts, where the second wavelength control unit may convert the first light to a third light. In such an embodiment, the color filter layer may include: a first color filter part overlapping the first wavelength control unit, where the first color filter part may transmit the second light; and a second color filter part overlapping the second wavelength control unit, where the second color filter part may transmit the third light.

In an embodiment, a portion of the first color filter part and a portion of the second color filter part may overlap the partition part.

In an embodiment, the wavelength control layer may further include a transmission part disposed in an opening part, in which the first wavelength control unit and the second wavelength control unit are not disposed among the opening parts, where the transmission part may transmit the first light.

In an embodiment, the second light control layer may overlap the transmission part, where a portion of the second light control layer overlapping the transmission part may directly contact the cover layer.

In an embodiment, the first wavelength control unit and the second wavelength control unit may include a quantum dot, where the transmission part may include a scatterer.

In an embodiment, the transmission part may further include a colorant which transmits the first light and absorbs the second light and the third light.

In an embodiment, a thickness of the transmission part may be greater than a thickness of the first wavelength control unit and a thickness of the second wavelength control unit.

In an embodiment, the light emitting element may be an organic light emitting diode element, a micro light emitting diode element or a nano light emitting diode element.

In an embodiment of the invention, a display device includes: a light emitting element layer which outputs a first light; a wavelength control layer disposed on the light emitting element layer; and a light control member disposed on the wavelength control layer, where the light control member includes: an inorganic layer disposed on the wavelength control layer; a first light control layer disposed on the inorganic layer; and a color filter layer disposed on the first light control layer. In such an embodiment, a thickness of the inorganic layer is in a range of about 2.5 kÅ to about 3.5 kÅ.

In an embodiment, the light control member may further include a second light control layer between the first light control layer and the color filter layer, where each of a refractive index of the inorganic layer and a refractive index of the second light control layer may be in a range of about 1.4 to about 1.5.

In an embodiment, a thickness of the second light control layer may be in a range of about 0.5 kA to about 1.5 kA and about 2.5 kA to about 3.5 kÅ.

In an embodiment, the wavelength control layer may include: a first wavelength control unit including a first quantum dot which converts the first light into red light; a second wavelength control unit including a second quantum dot which converts the first light into green light; and a transmission part including a blue colorant and a scatterer. In such an embodiment, the color filter layer may include: a first color filter part overlapping the first wavelength control unit, where the first color filter part may transmit the red light; and a second color filter part overlapping the second wavelength control unit, where the second color filter part may transmit the green light.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
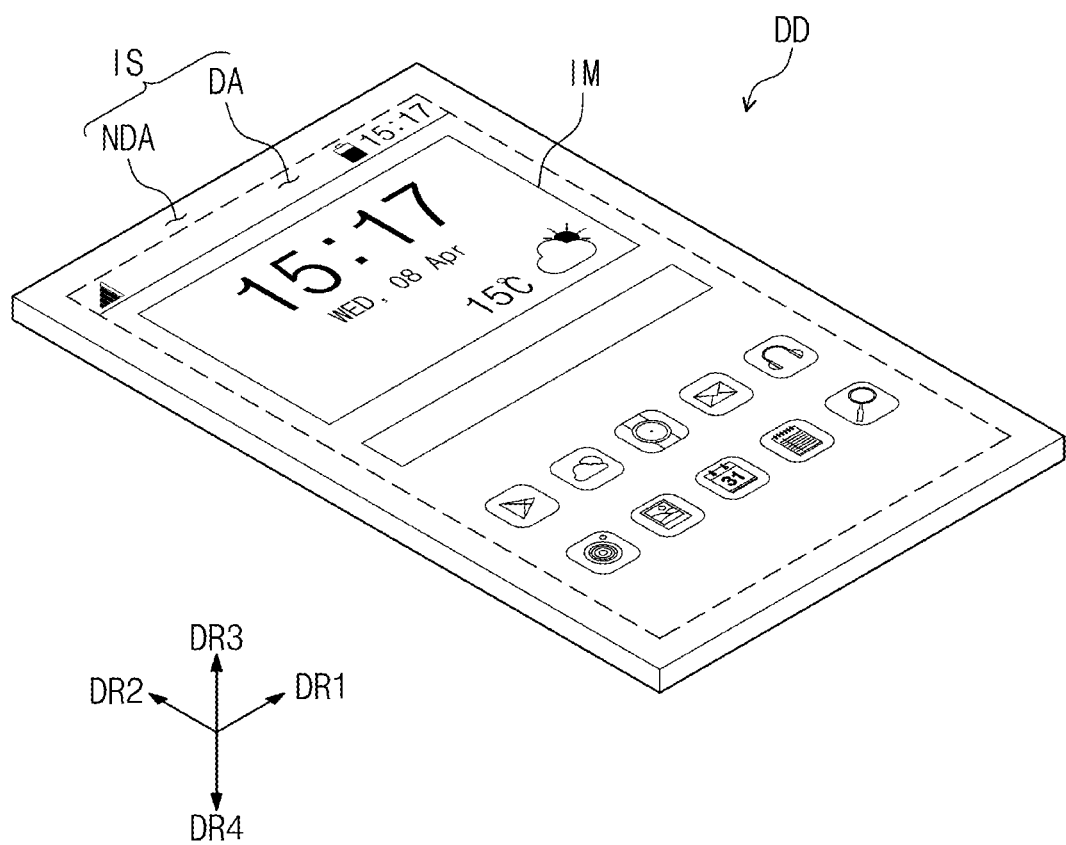
FIG. 1 is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. In the drawings, the thicknesses, proportions, and dimensions of components are exaggerated for effective description.

In this specification, when it is mentioned that a component (or, an area, a layer, a part, etc.) is referred to as being "on", "connected to" or "combined to" another component, this means that the component may be directly on, connected to, or combined to the other component or a third component therebetween may be present therebetween. In contrast, when an element is referred to as being "directly on", "connected directly to" or "combined directly to" another element, there are no intervening elements present.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that the terms "first" and "second" are used herein to describe various components but these components should not be limited by these terms. The above terms are used only to distinguish one component from another. For example, a first component may be referred to as a second component and vice versa without departing from the scope of the invention. The terms of a singular form may include plural forms unless otherwise specified.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as terms commonly understood by those skilled in the art to which this invention belongs. In general, the terms defined in the dictionary should be considered to have the same meaning as the contextual meaning of the related art, and, unless clearly defined herein, should not be understood abnormally or as having an excessively formal meaning.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of a display device according to the invention will be described in detail with reference to the accompanying drawings.

FIG. 1 is a perspective view of a display device according to an embodiment of the invention.

In an embodiment, as shown in FIG. 1, the display device DD may be a portable electronic device. Alternatively, the display device DD may be a medium-sized electronic device such as personal computers, notebook computers, personal digital assistants, car navigation units, game machines, smart phones, tablets and cameras, or a large-sized electronic device such as televisions, monitors, or external billboards. However, embodiments of the display device DD are not limited to those listed above, but the display device DD may be another electronic device, without departing from the scope of the invention.

An embodiment of the display device DD may have a hexahedral shape having a thickness in the third direction DR3 on a plane defined by a first direction DR1 and a second direction DR2 intersecting each other, but not being limited thereto. Alternatively, the display device DD may have one of various shapes.

Herein, the upper surface (or front surface) and the lower surface (or back surface) of each member is defined based on the direction in which the image IM is displayed. The upper surface and the lower surface may be opposite to each other in the third direction DR3, and the normal directions of the upper surface and the lower surface may be parallel to the third direction DR3 and a fourth direction DR4. Here, the fourth direction DR4 is a direction opposite to the third direction DR3.

Herein, the directions indicated by the first to fourth directions DR1, DR3, DR3, and DR4 are relative concepts and may be converted to other directions. Hereinafter, the first to fourth directions refer to the same reference numerals in the directions indicated by the first to fourth directions DR1, DR2, DR3, and DR4, respectively.

The display device DD may display the image IM through a display surface IS. The display surface IS includes a display area DA for displaying the image IM and a non-display area NDA adjacent to the display area DA. The non-display area NDA is an area on which no image is displayed. The image IM may be a dynamic image or a static image. In an embodiment, as shown in FIG. 1, the image IM may include a plurality of application icons and a clock.

The display area DA may be in a rectangular shape. The non-display area NDA may surround the display area DA. However, the invention is not limited thereto, and a form of the display area DA and a form of the non-display area NDA may be variously modified. In an embodiment, the non-display area NDA on a front surface of the display device DD may be omitted.

In an embodiment, the display device DD may be flexible. In such an embodiment, the display device DD may have a property that allows the display device DD to be bent, which includes a fully folded structure to a structure that may be bent at a level of several nanometers. In one embodiment, for example, the display device DD may be a curved display device or a foldable display device. However, the invention is not limited thereto, and alternatively, the display device DD may be rigid.

Figure 2:
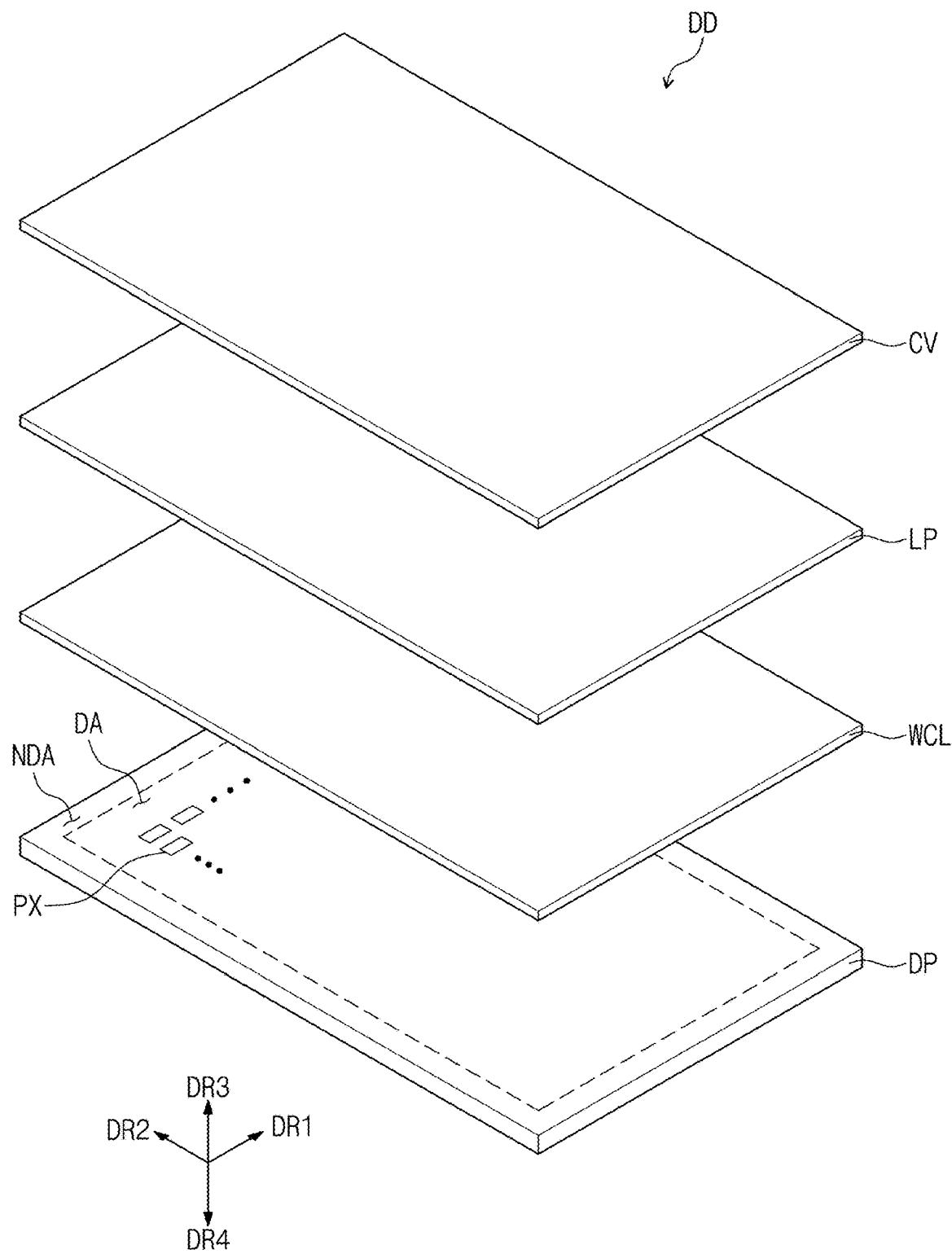
FIG. 2 is an exploded perspective view of a display device according to an embodiment of the invention.

FIG. 2 is an exploded perspective view of a display device according to an embodiment.

Referring to FIG. 2, an embodiment of the display device DD may include a display panel DP, a wavelength control layer WCL, a light control member LP, and a cover layer CV sequentially arranged along the third direction DR3.

In an embodiment, the display panel DP may include a plurality of pixels PX in an area corresponding to the display area DA of the display device DD. The plurality of pixels PX may be arranged to be spaced apart from each other in the display area DA. The pixels PX may display an image IM on the display area DA by outputting light having color information based on an electrical signal. The plurality of pixels PX may correspond to a pixel area PXA (see FIG. 3).

In an embodiment, the display panel DP may be a light emitting display panel. In one embodiment, for example, the display panel DP may be an organic light emitting display panel, a quantum dot light emitting display panel, a micro light emitting diode ("LED") display panel, or a nano LED display panel. The light emitting layer of the organic light emitting display panel may include an organic light emitting material. The light emitting layer of the quantum dot light emitting display panel may include a quantum dot and/or a quantum rod. The micro LED display panel may include a micro LED element, which is an ultra-small light emitting element, and the nano LED display panel may include a nano LED element.

In an embodiment, the wavelength control layer WCL may be disposed on the display panel DP. The wavelength control layer WCL transmits light outputted from the display panel DP or converts the light from the display panel DP into light having a different wavelength to output various color lights.

In an embodiment, the light control member LP may be disposed on the wavelength control layer WCL. The light control member LP may increase light conversion efficiency by reflecting light transmitted through the wavelength control layer WCL back to the wavelength control layer WCL. In such an embodiment, the light control member LP may improve the visibility of the light provided by the wavelength control layer WCL by reducing the reflectance of light incident from the outside to the display device DD.

In an embodiment, the cover layer CV may be disposed on the light control member LP. The cover layer CV may protect components disposed under the cover layer CV from external factors. The cover layer CV may include glass.

Figure 3:
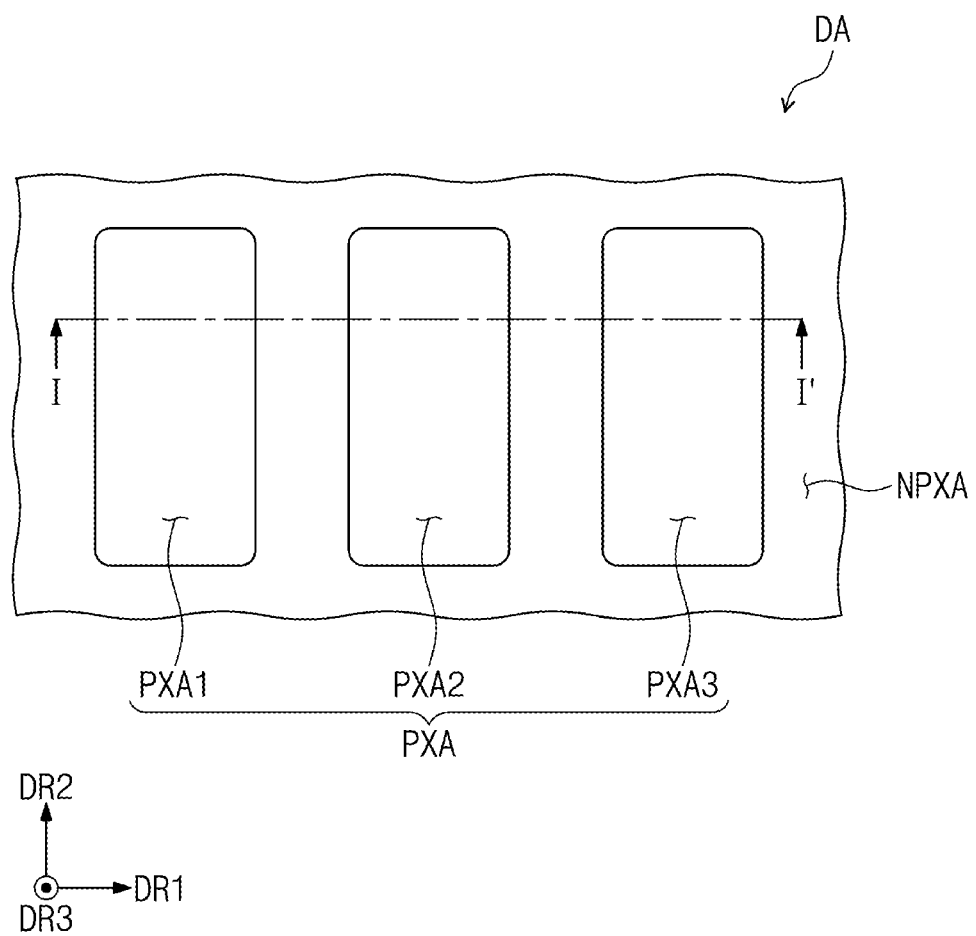
FIG. 3 is an enlarged plan view of a portion of the display area illustrated in FIG. 2.

FIG. 3 is an enlarged view of a portion of the display area DA shown in FIG. 2. The display area DA may include a pixel area PXA and a peripheral area NPXA adjacent to the pixel area PXA.

For convenience of illustration and description, FIG. 3 mainly shows three types of pixel areas PXA1, PXA2, and PXA3. The three types of pixel areas PXA1, PXA2, and PXA3 shown in FIG. 3 may be repeatedly disposed in the entire display area DA. The peripheral area NPXA may set a boundary between the first to third pixel areas PXA1, PXA2, and PXA3 to prevent color mixing between the first to third pixel areas PXA1, PXA2, and PXA3.

In an embodiment, as shown in FIG. 3, the first to third pixel areas PXA1, PXA2, and PXA3 may have a same planar area as each other, but are not limited thereto. Alternatively, the first to third pixel areas PXA1, PXA2, and PXA3 may have different areas from each other, or only one or two of the first to third pixel areas PXA1, PXA2, and PXA3 may have different areas from another. The shapes of the first to third pixel areas PXA1, PXA2, and PXA3 are not limited to the illustrated rectangular shape and may have another shape such as a polygonal shape.

One of the first to third pixel areas PXA1, PXA2, and PXA3 provides a first light to the user, another provides a second light different from the first light, and the remaining one provides a third light different from the first light and the second light. In one embodiment, for example, the first pixel area PXA1 provides red light, the second pixel area PXA2 provides green light, and the third pixel area PXA3 provides blue light.

Each of the first to third pixel areas PXA1, PX2, and PXA3 may correspond to the pixel PX (see FIG. 2). The first to third pixel areas PXA1, PX2, and PXA3 may provide or emit different color light from each other based on an electrical signal applied thereto. Accordingly, the plurality of pixels PX corresponding to the first to third pixel areas PXA1, PX2, and PXA3 may output light having color information.

Figure 4:
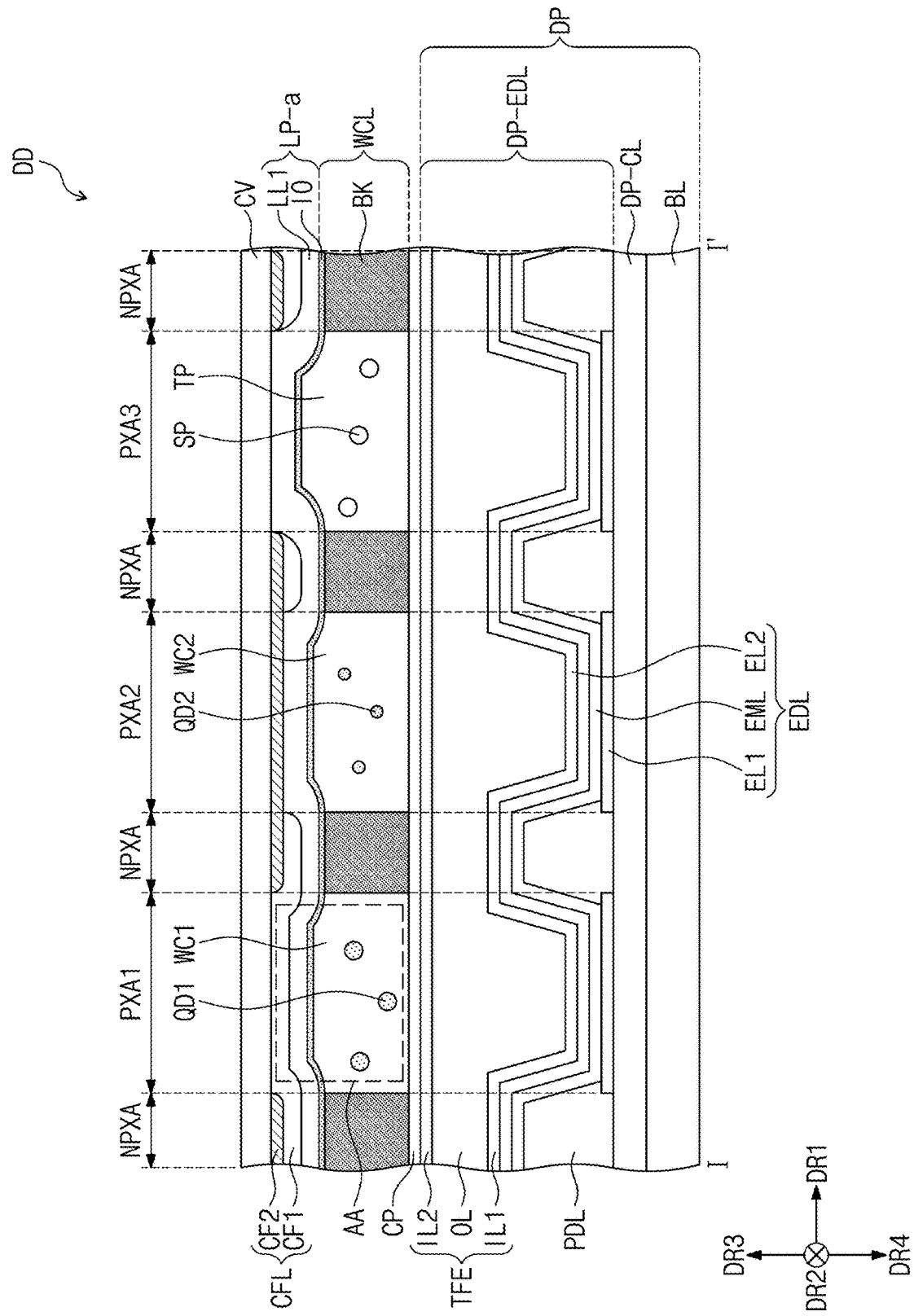
FIG. 4 is a cross-sectional view of a display device according to an embodiment of the invention.
Figure 5:
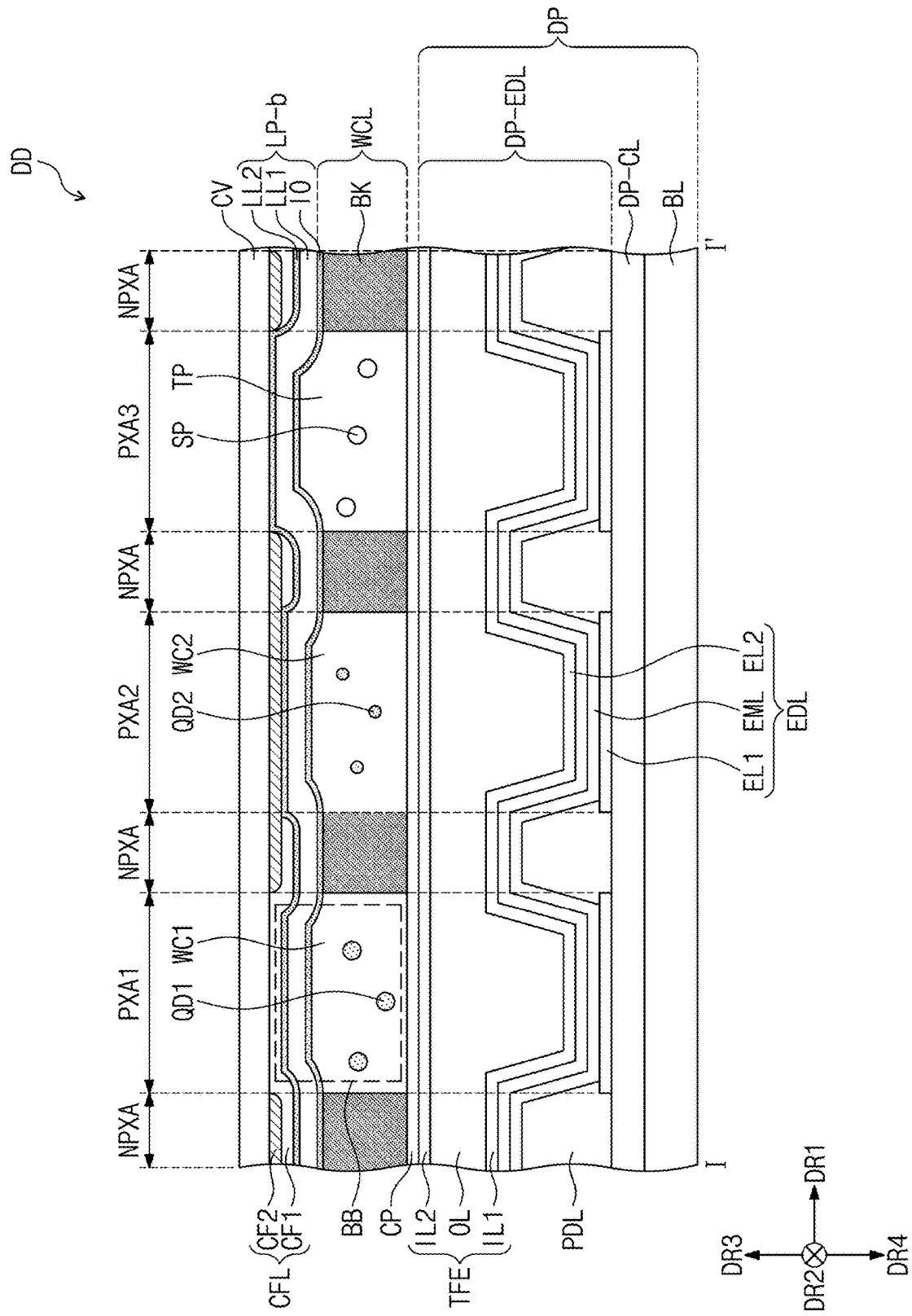
FIG. 5 is a cross-sectional view of a display device according to an embodiment of the invention.
Figure 6:
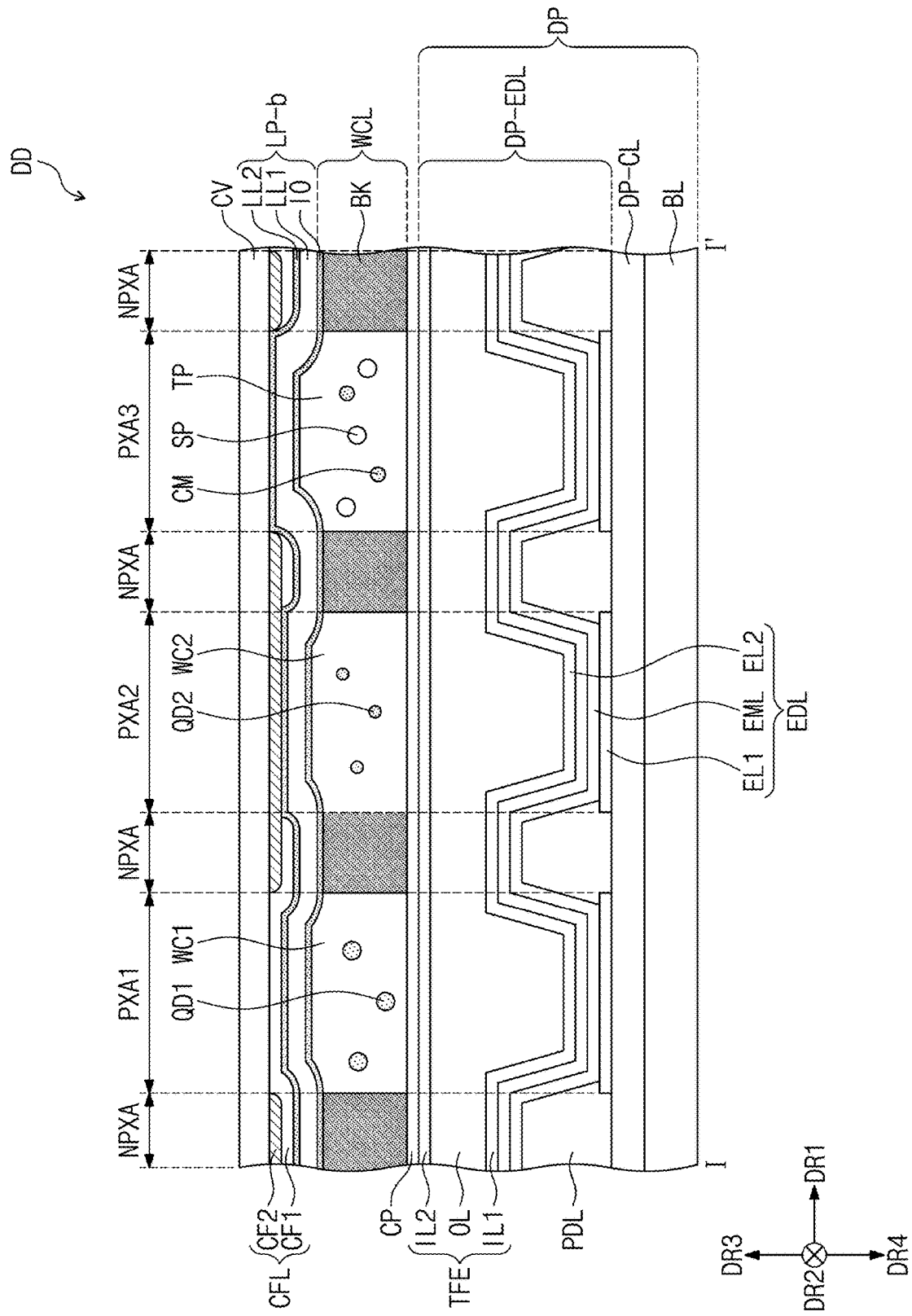
FIG. 6 is a cross-sectional view of a display device according to an embodiment of the invention.

FIGS. 4 to 6 are cross-sectional views taken along line I-I' of FIG. 3 of a display device according to embodiments. Each of embodiments of the display device DD illustrated in FIGS. 4 to 6 includes a display panel DP, a cover layer CV, a light control member LP-a and LP-b, and a wavelength control layer WCL. The embodiments of the display device DD illustrated in FIGS. 4 to 6 have substantially a same configuration as each other except for the wavelength control layer WCL and the light control members LP-a and LP-b. Hereinafter, embodiments of the invention will be described with reference to FIGS. 4 to 6.

In an embodiment, the display panel DP may include a base layer BL, a circuit layer DP-CL, and a light emitting element layer DP-EDL sequentially stacked along the third direction DR3. Pixel areas PXA1, PXA2, and PXA3 and a peripheral area NPXA adjacent to the pixel areas PXA1, PXA2, and PXA3 may be defined in the display panel DP. In FIGS. 4 to 6, three types of pixel areas, i.e., first to third pixel areas PXA1, PXA2, and PXA3 are shown.

The base layer BL included in the display panel DP may be rigid or flexible. The base layer BL may be a polymer substrate, a plastic substrate, a glass substrate, a metal substrate, or a composite material substrate. In one embodiment, for example, the base layer BL may be a flexible substrate including a polyimide resin. However, the material included in the base layer BL is not limited to those described above.

The circuit layer DP-CL may be disposed on the base layer BL. The circuit layer DP-CL may include a plurality of transistors (not shown). Each of the transistors (not shown) may include a control electrode, an input electrode, and an output electrode. In one embodiment, for example, the circuit layer DP-CL may include a switching transistor and a driving transistor for driving a light emitting element EDL.

The light emitting element layer DP-EDL may be disposed on the circuit layer DP-CL. The light emitting element layer DP-EDL may include a pixel defining film PDL, the light emitting element EDL, and an encapsulation layer TFE. The light emitting element layer DP-EDL may display an image by emitting light corresponding to an electrical signal transmitted through a plurality of transistors (not shown) included in the circuit layer DP-CL.

The light emitting element EDL may be disposed in the pixel areas PXA1, PXA2, and PXA3. The light emitting element EDL may include a first electrode EL1, a second electrode EL2, and a light emitting layer EML. The first electrode EL1 and the second electrode EL2 may be disposed opposite to each other. The light emitting layer EML may be disposed between the first electrode EL1 and the second electrode EL2.

The light emitting element EDL may generate light by activating the light emitting layer EML based on a potential difference between the first electrode EL1 and the second electrode EL2. The light emitting element EDL may be an organic light emitting diode ("OLED") element, a micro LED element, or a nano LED element.

The light emitting layer EML may include an organic light emitting material, an inorganic light emitting material, and the like, and may include a micro-scale or nano-scale light-emitting body or unit. The light emitting element EDL may generate first light by recombining holes and electrons injected from the first electrode EL1 and the second electrode EL2 in the light emitting layer EML.

The first light may be blue light. The blue light may be light in a wavelength range of about 410 nanometers (nm) to about 480 nm, but is not limited thereto, and may be in a wavelength range recognized as a blue color. However, the first light is not limited to the blue light, but the first light may be designed as light of one of various colors.

Although not shown in the drawings, the light emitting element EDL may further include a hole transport area and an electron transport area. The hole transport area may be disposed between the light emitting layer EML and the first electrode EL1, and the electron transport area may be disposed between the light emitting layer EML and the second electrode EL2. The hole transport area may transport holes injected from the first electrode EL1 to the light emitting layer EML. The electron transport area transports electrons injected from the second electrode EL2 to the light emitting layer EML. In an embodiment, each of the light emitting layer EML, the electron transport area, and the hole transport area may also be provided in plurality, but not being limited thereto.

The pixel defining film PDL may be disposed on the circuit layer DP-CL. Predetermined opening parts may be defined in the pixel defining film PDL. The opening parts defined in the pixel defining film PDL may correspond to pixel areas PXA1, PXA2, and PXA3, respectively. The pixel defining film PDL may correspond to the peripheral area NPXA.

The pixel defining film PDL may include an organic resin or an inorganic material. In one embodiment, for example, the pixel defining film PDL may include or be formed of a polyacrylate-based resin, a polyimide-based resin, silicon nitride (SiNx), silicon oxide (SiOx), or silicon nitrate (SiOxNy).

The encapsulation layer TFE may be disposed on the light emitting element EDL to seal the light emitting element EDL. The encapsulation layer TFE may protect the light emitting element EDL from moisture/oxygen and protect the light emitting element EDL from foreign substances such as dust particles.

The encapsulation layer TFE may include an organic film or an inorganic film. In one embodiment, for example, the encapsulation layer TFE may include an organic film and an inorganic film. The encapsulation layer TFE may have a structure in which the organic film OL and the inorganic films IL1 and IL2 are alternately stacked one on another.

The inorganic film included in the encapsulation layer TFE may include, for example, a silicon nitride layer, a silicon oxy nitride layer, a silicon oxide layer, a titanium oxide layer, or an aluminum oxide layer, but not being limited thereto. The organic film included in the encapsulation layer TFE may include an acrylic-based organic film, but not being limited thereto.

The display device DD may include the cover layer CV, the light control member LP-a and LP-b, the wavelength control layer WCL, and a capping layer CP disposed on the display panel DP. The cover layer CV, the light control member LP-a and LP-b, the wavelength control layer WCL and the capping layer CP may be sequentially disposed on the display panel DP in the fourth direction DR4.

The cover layer CV may be disposed on the display panel DP. The cover layer CV may protect components disposed below. The cover layer CV serves as a substrate for forming the light control member LP-a and LP-b and the wavelength control layer WCL, which may be disposed between the cover layer CV and the display panel DP. The cover layer CV may include glass.

The light control members LP-a and LP-b may be disposed on the cover layer CV in the fourth direction DR4. The light control members LP-a and LP-b may reduce the external light reflectance of the display device DD and improve the light output efficiency. Each of the light control members LP-a and LP-b may include a color filter layer CFL, a light control layer LL1 or LL2, and an inorganic layer IO.

The color filter layer CFL may be disposed on the cover layer CV in the fourth direction DR4. The color filter layer CFL may be disposed directly on the cover layer CV. The color filter layer CFL may have a patterned structure formed on the cover layer CV. The color filter layer CFL may reduce reflection of external light and prevent color mixing. The color filter layer CFL may include a first color filter part CF1 and a second color filter part CF2. Each of the color filter parts CF1 and CF2 may transmit light only in a specific wavelength range and absorb light in the remaining wavelength range.

The second color filter part CF2 may be disposed on the cover layer CV in the fourth direction DR4. The front surface of the second color filter part CF2 may directly contact the cover layer CV. The second color filter part CF2 may be formed on a portion of the cover layer CV. The second color filter part CF2 may be arranged to overlap some pixel areas among the plurality of pixel areas. Referring to FIGS. 4 to 6, the second color filter part CF2 may overlap the second pixel area PXA2. A portion of the second color filter part CF2 may overlap the peripheral area NPXA.

The second color filter part CF2 may transmit third light having a wavelength range different from that of the first light provided by the light emitting element EDL, and block the first light and the second light. In one embodiment, for example, the third light may be green light. The green light may be light in a wavelength range of about 495 nm to about 570 nm, but is not limited thereto, and may include a wavelength range recognized as a green color. The second color filter part CF2 may include a green pigment or a green dye.

The first color filter part CF1 may be disposed on the cover layer CV in the fourth direction DR4. A portion of the first color filter part CF1 may be in direct contact with the cover layer CV, and another portion may be in contact with a portion of the second color filter part CF2. The first color filter part CF1 may be formed in a portion of the cover layer CV on which the second color filter part CF2 is formed. The first color filter part CF1 may be arranged to overlap some pixel areas among the plurality of pixel areas. Referring to FIGS. 4 to 6, the first color filter part CF1 may overlap the first pixel area PXA1 that is non-overlapping with the second color filter part CF2. A portion of the first color filter part CF1 may overlap the peripheral area NPXA.

The first color filter part CF1 may transmit second light having a wavelength range different from the first light provided by the light emitting element EDL, and may block the first light and the third light. In one embodiment, for example, the second light may be red light. The red light may be light having a wavelength range of about 620 nm to about 750 nm, but is not limited thereto, and may include a wavelength range recognized as a red color. The first color filter part CF1 may include a red pigment or a red dye.

A portion of the first color filter part CF1 and a portion of the second color filter part CF2 may be disposed to overlap the peripheral area NPXA. A portion of the first color filter part CF1 overlaps the peripheral area NPXA to cover a portion of the lower surface of the second color filter part CF2. The first color filter part CF1 may block the first light and the third light, and the second color filter part CF2 may block the first light and the second light. Therefore, the overlapping portion of the first color filter part CF1 and the second color filter part CF2 may serve as a light blocking layer and effectively prevent light leakage.

In an alternative embodiment, although not illustrated in the drawing, the color filter layer CFL may further include a light blocking part including a light blocking material. The light blocking part may be disposed to overlap the peripheral area NPXA. The plurality of color filter parts may be spaced apart from each other with an adjacent light blocking part interposed therebetween. Therefore, the light blocking part may be a boundary between color filter parts.

A color filter layer CFL may not be disposed on some areas of the cover layer CV. The color filter layer CFL may not be placed in an area overlapping some pixel areas among the plurality of pixel areas. Referring to FIGS. 4 to 6, a color filter part is not disposed in an area overlapping the third pixel area PXA3. Therefore, the first color filter part CF1 and the second color filter part CF2 may not overlap the third pixel area PXA3 in the third direction DR3.

The light control layer LL1 or LL2 may be disposed on the color filter layer CFL in the fourth direction DR4. According to an embodiment of the light control member, a single light control layer may be included, or a plurality of light control layers having different refractive indices from each other may be included. FIG. 4 shows an embodiment where a light control member LP-a includes a single control layer, e.g., a first light control layer LL1, and FIG. 5 shows an embodiment where a light control member LP-b includes a plurality of light control layers, e.g., a first light control layer LL1 and a second light control layer LL2.

The first light control layer LL1 may be disposed on the color filter layer CFL in the fourth direction DR4, and referring to FIG. 4, may be directly disposed on the lower surface of the color filter layer CFL. The first light control layer LL1 may be disposed on the cover layer CV where the first color filter part CF1 and the second color filter part CF2 are disposed to cover the lower surface of the first color filter part CF1 and the second color filter part CF2. In the area where the color filter part is not disposed, the first light control layer LL1 may directly contact the cover layer CV.

The first light control layer LL1 may have a relatively low refractive index compared to other stacked structures. In one embodiment, for example, the refractive index of the first light control layer LL1 may be about 1.3 or less. The first light control layer LL1 may reflect the light provided through the display panel DP at a wider angle using a difference in refractive index and improve a viewing angle.

The wavelength control layer WCL may be disposed below the first light control layer LL1. The wavelength may convert light provided by the display panel DP into light in a different wavelength range and provide light of various colors. The first light control layer LL1 may increase the wavelength conversion efficiency of light by reflecting light having no wavelength conversion back to the wavelength control layer WCL using a difference in refractive index.

The first light control layer LL1 may include an organic film, and may further include inorganic particles included in the organic film. In one embodiment, for example, the organic film may include acrylic, polysiloxane, polyurethane, polyimide or the like, and the inorganic particles may include silica or the like, but not being limited thereto.

The inorganic layer IO may be disposed on the first light control layer LL1 in the fourth direction DR4. The inorganic layer IO may be directly disposed on the first light control layer LL1 and may cover the lower surface of the first light control layer LL1. The wavelength control layer WCL may be disposed under the inorganic layer IO.

A refractive index of the inorganic layer IO may be less than a refractive index of the wavelength control layer WCL, and may be greater than a refractive index of the first light control layer LL1. The inorganic layer IO may reduce the difference between the refractive index of the first light control layer LL1 and the refractive index of the wavelength control layer WCL, thereby reducing the amount of light reflected and reducing external light reflection. In one embodiment, for example, the refractive index of the inorganic layer IO may be in a range of about 1.4 to about 1.5.

The inorganic layer IO may include an inorganic material satisfying the refractive index relationship described above. In one embodiment, for example, the inorganic layer IO may include silicon oxide (SiOx), but is not limited thereto.

The inorganic layer IO may have a specific thickness to reduce light reflectance in a specific wavelength range. The reflectance of light irradiated to the inorganic layer IO may be repeatedly increased and decreased depending on the wavelength. The wavelength range in which the reflectance is reduced may vary depending on the thickness of the inorganic layer IO. Therefore, the light reflectance in the visible light region may be reduced by adjusting the thickness of the inorganic layer IO. In one embodiment, for example, the thickness of the inorganic layer IO may be in a range of about 2.5 kiloangstrom (kÅ) to about 3.5 kÅ.

Referring to FIG. 5, in an alternative embodiment, the light control member LP-b may further include a second light control layer LL2. The second light control layer LL2 may be disposed between the color filter layer CFL and the first light control layer LL1. Accordingly, the second light control layer LL2 may be disposed directly on the lower surface of the color filter layer CFL, and the first light control layer LL1 may be directly disposed directly on the lower surface of the second light control layer LL2. In the area where the color filter part is not disposed, the second light control layer LL2 may directly contact the cover layer CV. The second light control layer LL2 may be disposed or formed on the cover layer CV where the first color filter part CF1 and the second color filter part CF2 are disposed to cover the lower surface of the first color filter part CF1 and the second color filter part CF2.

The external light visibility of the display device DD may be improved by adjusting the refractive index or thickness of the second light control layer LL2. The refractive index of the second light control layer LL2 may be less than the refractive index of the color filter layer CFL, and may be greater than the refractive index of the first light control layer LL1. The second light control layer LL2 may reduce the difference between the refractive index of the first light control layer LL1 and the refractive index of the color filter layer CFL, thereby reducing the amount of light reflected and reducing external light reflection. In one embodiment, for example, the refractive index of the second light control layer LL2 may be in a range of about 1.4 to about 1.5.

The second light control layer LL2 may include an inorganic film satisfying the refractive index relationship described above. In one embodiment, for example, the inorganic film may be a silicon oxide (SiOx) inorganic film. However, the material of the inorganic film is not limited thereto.

The second light control layer LL2 may include an organic film satisfying the refractive index relationship described above. The second light control layer LL2 may include an optically transparent organic film.

The organic film included in the second light control layer LL2 may have a light transmittance in the yellow light wavelength range, which is less than a light transmittance in the blue light wavelength range. In one embodiment, for example, the organic film included in the second light control layer LL2 may have a light transmittance in the wavelength range of about 560 nm to about 630 nm, which is lower than the light transmittance in the wavelength range of about 450 nm to about 500 nm. However, the wavelength range is not limited thereto, and the yellow light wavelength range and the blue light wavelength range may include a wavelength range recognized as yellow and blue, respectively.

In one embodiment, for example, the light transmittance of the second light control layer LL2 may have a same trend as the graph illustrated in FIG. 7 and will be described later in detail with reference to FIG. 7. When the second light control layer LL2 includes the above-described organic film, the external light reflectance of the display device DD may be more effectively reduced.

By controlling the thickness of the second light control layer LL2, the effect of reducing external light reflectance may be improved. The light reflected at the interface between the color filter layer CFL and the second light control layer LL2 and the light reflected at the interface between the inorganic layer 10 and the wavelength control layer WCL may be destructively inteferenced, and the degree of destructive interference may vary depending on the thickness of the second light control layer LL2 and the inorganic layer IO. In an embodiment, where the second light control layer LL2 includes an inorganic film, the external light reflectance effect according to the thickness control may be greater. In one embodiment, for example, the thickness of the second light control layer LL2 may be in a range of about 0.5 kÅ to about 1.5 kÅ and about 2.5 kÅ to about 3.5 kÅ.

Referring to FIGS. 4 to 6, the wavelength control layer WCL may be disposed in the fourth direction DR4 on the inorganic layer IO. The wavelength control layer WCL can be in direct contact with the inorganic layer IO, thereby protecting the upper surface of the wavelength control layer WCL from moisture, oxygen or foreign matter.

The wavelength control layer WCL may transmit light provided by the light emitting element EDL or convert light provided by the light emitting element EDL into light having a different wavelength range. The wavelength control layer WCL may provide light having different colors in correspondence with the first to third pixel areas PXA1, PXA2, and PXA3.

The wavelength control layer WCL may include a partition part BK in which a plurality of opening parts are defined, a first wavelength control unit WC1, and a second wavelength control unit WC2. The wavelength control layer WCL may further include a transmission part TP.

The partition part BK may be disposed on the lower surface of the inorganic layer IO. The partition part BK may directly contact the inorganic layer TO. After placing the light control members LP-a and LP-b on the cover layer CV, the partition part BK, in which the plurality of opening parts are defined, may be provided or formed on the light control members LP-a and LP-b. The partition part BK may overlap the peripheral area NPXA. The partition part BK may prevent light leakage and define a boundary between adjacent wavelength control units WC1 and WC2 and the transmission part TP. The partition part BK may include an organic material. The partition part BK may include an organic light blocking material including black pigment or dye.

A portion of the first color filter part CF1 and a portion of the second color filter part CF2 may overlap the partition part BK. A portion of the first color filter part CF1 and a portion of the second color filter part CF2 may be in contact with each other on the partition part BK.

The first wavelength control unit WC1 may be disposed in one of the plurality of opening parts defined in the partition part BK, and the second wavelength control unit WC2 may be disposed in another of the plurality of opening parts. In such an embodiment, the second wavelength control unit WC2 may be disposed in opening parts of the partition part BK in which the first wavelength control unit WC1 is not disposed.

In an embodiment, the wavelength control layer WCL may further include a transmission part TP. The transmission part TP may be disposed in one of a plurality of opening parts defined in the partition part BK. The transmission part TP may be disposed in opening parts of the partition part BK in which the first wavelength control unit WC1 and the second wavelength control unit WC2 are not disposed. Accordingly, each of the first wavelength control unit WC1, the second wavelength control unit WC2, and the transmission part TP is spaced apart from each other when viewed on a plane defined by the first direction DR1 and the second direction DR2.

The first wavelength control unit WC1 and the second wavelength control unit WC2 may be disposed under the inorganic layer IO. The first wavelength control unit WC1 and the second wavelength control unit WC2 may be in direct contact with the inorganic layer IO.

The first wavelength control unit WC1 may be arranged to overlap the first pixel area PXA1. The first wavelength control unit WC1 may overlap the first color filter part CF1. The first wavelength control unit WC1 may convert the first light provided by the display panel DP into second light having a different wavelength range. In one embodiment, for example, the second light may be red light. Therefore, the first pixel area PXA1 may provide red light.

The first wavelength control unit WC1 may include a base resin and a quantum dot QD1. The quantum dot QD1 may be dispersed in the base resin included in the first wavelength control unit WC1. The quantum dot QD1 included in the first wavelength control unit WC1 may be particles that convert the first light into second light in a different wavelength range.

The second wavelength control unit WC2 may be arranged to overlap the second pixel area PXA2. The second wavelength control unit WC2 may overlap the second color filter part CF2. The second wavelength control unit WC2 may convert the first light provided by the display panel DP into third light in a different wavelength range. In one embodiment, for example, the third light may be green light. Therefore, the second pixel area PXA2 may provide green light.

The second wavelength control unit WC2 may include a base resin and a quantum dot QD2. The quantum dot QD2 may be dispersed within the base resin included in the second wavelength control unit WC2. The quantum dot QD2 included in the second wavelength control unit WC2 may be particles that convert the first light into third light in a different wavelength range.

The quantum dots QD1 and QD2 included in the wavelength control units WC1 and WC2 may be a semiconductor nanocrystal including at least one material selected from group II-VI compound, group III-VI compound, group III-V compound, group IV-VI compound, group IV element or compound, group compounds, and a combination thereof.

The Group II-VI compound may include: bivalent element compounds selected from CdS, CdSe, CdTe, ZnS, ZnSe, ZnTe, ZnO, HgS, HgSe, HgTe, MgSe, MgS and a combination (e.g., a compound) thereof; trivalent element compounds selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a combination thereof; and tetravalent element compounds selected from CdZnSeS, CdZnSeTe, CdZnSTe, CdHgSeS, CdHgSeTe, CdHgSTe, HgZnSeS, HgZnSeTe, HgZnSTe and a combination thereof.

The group III-VI compound may include a binary element compound such as In2S3, In2Se3, and the like, a trielement compound such as InGaS3, InGaSe3, and the like, or any combination thereof.

The group III-V compound may include: bivalent element compounds selected from GaN, GaP, GaAs, GaSb, AlN, AlP, AlAs, AlSb, InN, InP, InAs, InSb and a combination thereof; trivalent element compounds selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP and combination thereof; and tetravalent element compounds selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and combination thereof.

The group III-V semiconductor compound may further include a group II metal such as InZnP.

The Group IV-VI compound may include: bivalent element compounds selected from the group consisting of SnS, SnSe, SnTe, PbS, PbSe, PbTe and a combination thereof; trivalent element compounds selected from SnSeS, SnSeTe, SnSTe, PbSeS, PbSeTe, PbSTe, SnPbS, SnPbSe, SnPbTe and a combination thereof and tetravalent element compounds selected from SnPbSSe, SnPbSeTe, SnPbSTe and a combination thereof. The group IV elements may include Si, Ge and a combination thereof. The IV group compound may include a bivalent element compound selected from SiC, SiGe and a combination thereof.

The group semiconductor compound may include AgInS, AgInS2, CuInS, CuInS2, CuGaO2, AgGaO2, AgAlO2, and the like, or any combination thereof.

In such an embodiment, the bivalent element compound, the trivalent element compound, or the tetravalent element compound may be in the particle at a uniform concentration, or may be in a same particle by dividing the concentration distribution into a partially different state.

In an embodiment, the quantum dots QD1 and QD2 may have a core shell structure including a core and a shell surrounding the core. In an embodiment, one quantum dot may have a core/shell structure surrounding other quantum dots. In the core-shell structure, a concentration of elements existing in the shell may have a concentration gradient that decreases toward the core.

In an embodiment, the shells of the quantum dots QD1 and QD2 may include an oxide of a metal or a nonmetal, semiconductor compound, or a combination thereof.

In one embodiment, for example, the metal or nonmetal oxide used in the shell may include a bivalent element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like or a trivalent element compound such as $MgAl_2O_4$, $CoFe_2O_4$, $NiFe_2O_4$, $CoMn_2O_4$, and the like, but the invention is not limited thereto.

In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the invention is not limited thereto.

The quantum dots QD1 and QD2 can control the color of emitted light according to the particle size, and thus the quantum dots QD1 and QD2 may have various luminescent colors such as green, red, and the like. As the particle size of the quantum dots QD1 and QD2 becomes smaller, the quantum dots QD1 and QD2 may emit light in the short wavelength region. In one embodiment, for example, the particle size of the quantum dot emitting green light may be smaller than the particle size of the quantum dot emitting red light.

The transmission part TP may be disposed under the inorganic layer IO. The transmission part TP may be in direct contact with the inorganic layer IO. The transmission part TP may be arranged to overlap the third pixel area PXA3. A color filter part may not be disposed on the transmission part TP. The transmission part TP may transmit the first light provided by the display panel DP. In one embodiment, for example, the first light may be blue light. Therefore, the third pixel area PXA3 may provide blue light.

The transmission part TP may include a base resin and a scatterer SP. The base resin included in the transmission part TP may be a transparent resin. The scatterer SP may be dispersed in the base resin included in the transmission part TP.

The scatterer SP scatters incident light in various directions to increase light output efficiency. The scatterer SP may include a light reflective material or a material having a predetermined refractive index. In one embodiment, for example, the scatterer SP may include at least one selected from $TiO_2$, $ZrO_3$, $Al_2O_3$, $SiO_2$, MgO, $In_2O_3$, ZnO, $SnO_2$, $Sb_2O_3$, $SiO_2$ and indium tin oxide ("ITO").

In an embodiment, although not shown in the drawing, the wavelength control units WC1 and WC2 may further include a scatterer SP. The scatterer SP may be dispersed in a base resin included in each of the first wavelength control unit WC1 and the second wavelength control unit WC2. The scatterer SP may be included in each of the first wavelength control unit WC1, the second wavelength control unit WC2, and the transmission part TP. However, the invention is not limited thereto, and the scatterer SP may be included only in one of the first wavelength control unit WC1, the second wavelength control unit WC2, and the transmission part TP.

A thickness of the transmission part TP may be greater than a thickness of the first wavelength control unit WC1 and a thickness of the second wavelength control unit WC2. As the color filter part is not placed on the transmission part TP, steps may be defined or formed on the light control member LP-a and LP-b, and the thickness of the transmission part TP may be greater than the thickness of the first wavelength control unit WC1 and the thickness of the second wavelength control unit WC2 to reduce the difference in that step.

Referring to FIG. 6, in an alternative embodiment, the transmission part TP may further include a colorant CM. The colorant CM may be dispersed in the base resin included in the transmission part TP. The colorant CM may transmit light in a specific wavelength range. The colorant CM transmits the first light provided by the display panel DP and absorbs the second light and the third light having a wavelength range different from the first light. In one embodiment, for example, the colorant CM can transmit blue light and absorb red light and green light. The colorant CM may be a blue colorant, and may include a blue pigment or blue dye.

After providing or forming the light control member LP-a and LP-b on the cover layer CV, the wavelength control layer WCL may be provided or formed by forming a partition part BK in which a plurality of opening parts are defined on the light control member LP-a and LP-b, providing a first wavelength control unit WC1 in some of the plurality of opening parts, placing a second wavelength control unit WC2 in another part, and providing a transmission part TP in the remaining part. The first wavelength control unit WC1, the second wavelength control unit WC2, and the transmission part TP may be formed using an inkjet process.

The capping layer CP may be disposed between the wavelength control layer WCL and the encapsulation layer TFE. The capping layer CP may be disposed on the lower surface of the wavelength control layer WCL to cover the wavelength control layer WCL. The capping layer CP may protect the wavelength control layer WCL from oxygen, moisture, and foreign matter. The capping layer CP may include at least one selected from silicon oxide, titanium oxide, and aluminum oxide, but not being limited thereto. In an alternative embodiment of the display device according to the invention, the capping layer CP may be omitted.

In an embodiment, a display device may be manufactured by sequentially stacking the light control members LP-a and LP-b, the wavelength control layer WCL and the capping layer CP on the cover layer CV along one direction and arranging the stacked structure in a way such that the capping layer CP is provided or disposed to face the encapsulation layer TFE, but not being limited thereto. An embodiment of the display device of the invention may be manufactured by other methods than the above-described manufacturing method.

Figure 7:
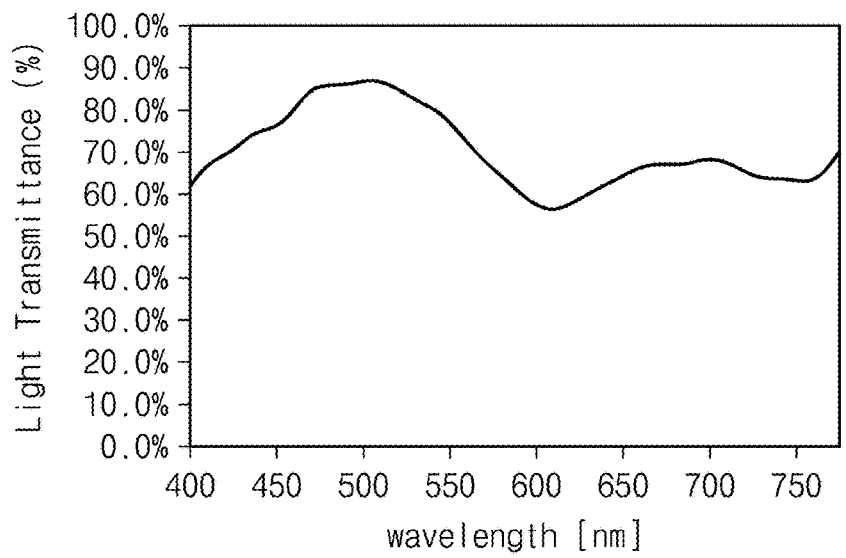
FIG. 7 is a graph showing the light transmittance according to the wavelength of the second light control layer according to an embodiment of the invention.

FIG. 7 shows a graph of light transmittance according to a wavelength of a second light control layer according to an embodiment. The second light control layer LL2 may include an organic film, in which the light transmittance in the yellow light wavelength range is less than the light transmittance in the blue light wavelength range. In one embodiment, for example, the light transmittance of the second light control layer LL2 may exhibit a trend as shown in the graph of FIG. 7.

Referring to FIG. 7, the light transmittance of the second light control layer LL2 gradually decreases for light having a wavelength of about 500 nm or greater, and may have a value of 70% or less in a wavelength range of about 565 nm to about 775 nm. In particular, the light transmittance in the wavelength range of 590 nm to 630 nm may have a value of 60% or less.

In an embodiment, the organic film having a light transmittance of the yellow light wavelength range less than the light transmittance of the blue light wavelength range is included in the second light control layer LL2, such that the transmittance of light having a wavelength of about 550 nm or greater among the external light in the visible light region may be reduced. Accordingly, in such an embodiment, the external light reflectance of the display device DD may be more effectively reduced by including the second light control layer LL2. However, the graph illustrated in FIG. 7 is merely an example, and the organic film included in the second light control layer LL2 is not limited to having a light transmittance value as illustrated in FIG. 7.

Figure 8:
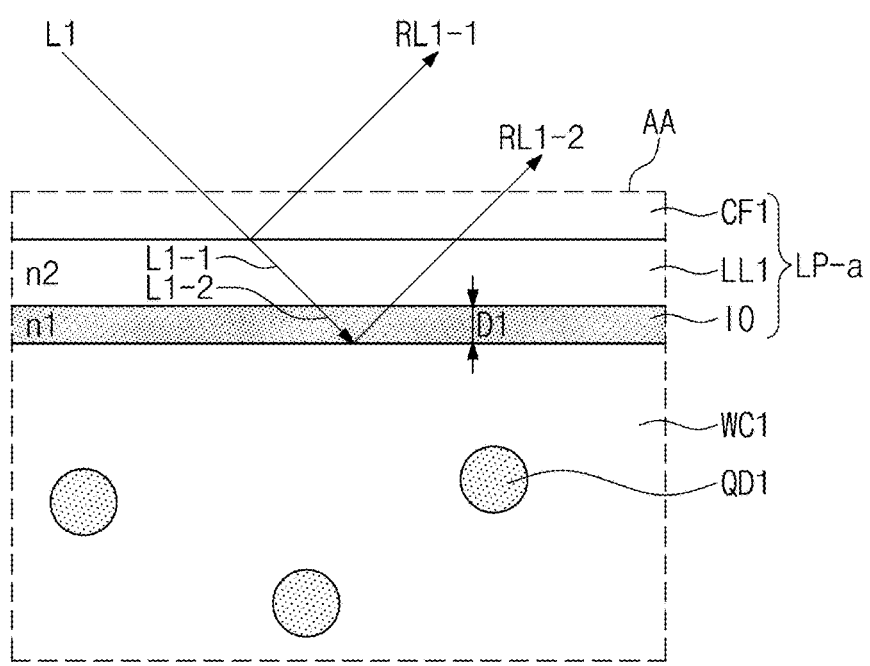
FIG. 8 is an enlarged cross-sectional view of a portion of the display device illustrated in FIG. 4.
Figure 9:
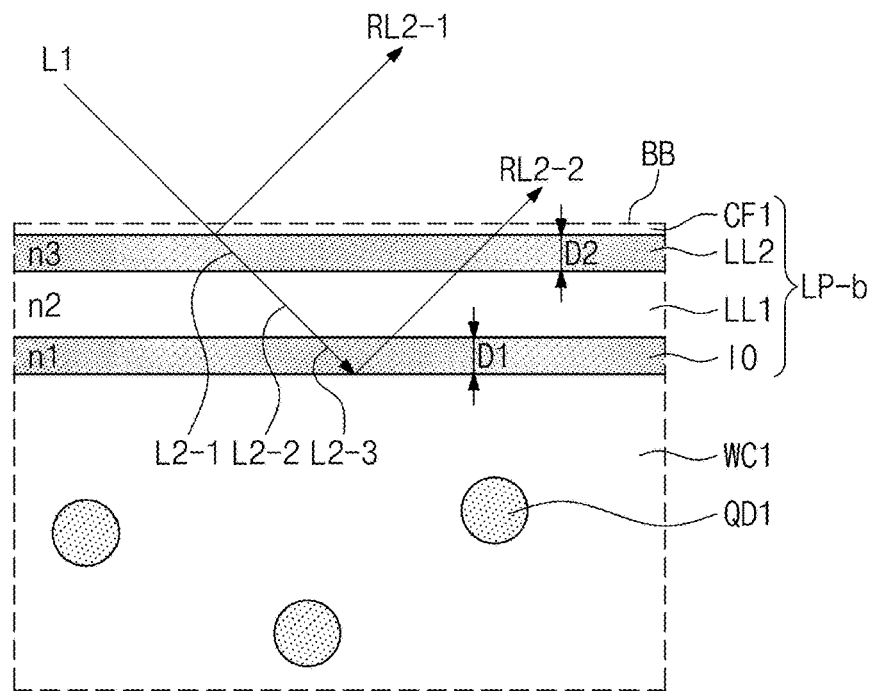
FIG. 9 is an enlarged cross-sectional view of a portion of the display device illustrated in FIG. 5.

FIG. 8 is an enlarged cross-sectional view of a portion AA of the display device illustrated in FIG. 4. FIG. 9 is an enlarged cross-sectional view of a portion BB of the display device illustrated in FIG. 5.

The speed of light may be changed or varied by a medium through which it passes. When the wave of light meets the interface of mediums having a different refractive index, some are transmitted but some are reflected. The reflected light may or may not change the phase depending on the refractive index of the medium.

Referring to FIG. 8, the upper surface of the first light control layer LL1 contacts the color filter part CF1, and the lower surface of the first light control layer LL1 contacts the inorganic layer IO. The upper surface of the inorganic layer IO is in contact with the first light control layer LL1, and the lower surface of the inorganic layer IO is in contact with the wavelength control unit WC1.

The inorganic layer IO may have a first refractive index n1, and the first light control layer LL1 may have a second refractive index n2. The second refractive index n2 may be less than the refractive index of the color filter part CF1 and the first refractive index n1. In an embodiment, the second refractive index n2 may be less than that of the color filter part CF1 and wavelength control unit WC1 to improve the viewing angle and increase the wavelength conversion efficiency. The first refractive index n1 may be greater than the second refractive index n2 and less than the refractive index of the wavelength control unit WC1.

In relation to the light L1 incident on a portion of the display device DD, some light L1-1 may be transmitted at the interface between the color filter part CF1 and the first light control layer LL1, and some light RL1-1 may be reflected. Some light L1-2 of the light L1-1 transmitted through the first light control layer LL1 may pass through the inorganic layer IO and some light of the light L1-2 may be reflected. Some light RL1-2 of the light L1-2 transmitted into the inorganic layer IO may be reflected at the interface between the inorganic layer IO and the wavelength control unit WC1.

As the difference in refractive index is greater, the critical angle at which total reflection occurs is less and the reflected amount of light is greater. Accordingly, the amount of reflected light may be reduced by arranging the inorganic layer IO having a refractive index value between the second refractive index n2 and the refractive index of the wavelength control unit WC1. The difference in refractive index between the first refractive index n1 and the wavelength control unit WC1 may be less than the difference in refractive index between the second refractive index n2 and the wavelength control unit WC1, so that the amount of light RL1-2 reflected at the interface between the inorganic layer IO and the wavelength control unit WC1 may be less than when the inorganic layer IO is not disposed.

In such an embodiment, the thickness D1 of the inorganic layer IO may affect light reflectance according to a wavelength range. The thickness D1 of the inorganic layer IO may be adjusted to reduce light reflectance in a wavelength range of the visible region, and the thickness D1 may be in a range of about 2.5 kÅ to about 3.5 kÅ.

Referring to FIG. 9, the light control member LP-b may further include a second light control layer LL2. The upper surface of the first light control layer LL1 contacts the second light control layer LL2, and the color filter part CF1 contacts the upper surface of the second light control layer LL2.

The second light control layer LL2 may have a third refractive index n3. The third refractive index n3 may be less than the refractive index of the color filter part CF and greater than the second refractive index n2.

In relation to the light L1 incident on a portion of the display device DD, some light L2-1 may be transmitted at the interface between the color filter part CF1 and the second light control layer LL2, and some light RL2-1 may be reflected. Some light L2-2 of the light L2-1 transmitted through the second light control layer LL2 may pass through the first light control layer LL1, and some light of the light L2-2 may be reflected. Some light L2-3 of the light L2-2 transmitted into the first light control layer LL1 may transmit the inorganic layer 10, and some light RL2-2 may be reflected at the interface between the inorganic layer 10 and the wavelength control unit WC1.

In such an embodiment, since the difference between the refractive index of the color filter part CF and the third refractive index n3 is less than the difference between the color filter part CF and the second refractive index n2, the amount of light L2-1 transmitted from the interface between the color filter part CF and the second light control layer LL2 may be greater than the amount of light L1-1 (see FIG. 7) transmitted from the interface between the color filter part CF and the first light control layer LL1. In such an embodiment, the amount of reflected light RL2-1 from the interface between the color filter part CF and the second light control layer LL2 may be less than the amount of the reflected light RL1-1 (see FIG. 7) from the interface between the color filter part CF and the first light control layer LL1.

When the phases of the wavelengths are opposite to each other, light having the opposite phases may cancel each other and the external light reflectance may be reduced through the destructive interference effect. The light RL1-1 and RL1-2 reflected at each interface may cancel out depending on the phase. The destructive interference effect may be maximized by adjusting the thickness D1 of the inorganic layer 10 and the thickness D2 of the second light control layer LL2. In one embodiment, for example, the thickness of the inorganic layer 10 may be in a range of about 2.5 kÅ to about 3.5 kÅ, and the thickness of the second light control layer LL2 may be in a range of about 0.5 kÅ to about 1.5 kÅ and about 2.5 kÅ to about 3.5 kÅ.

Figure 10:
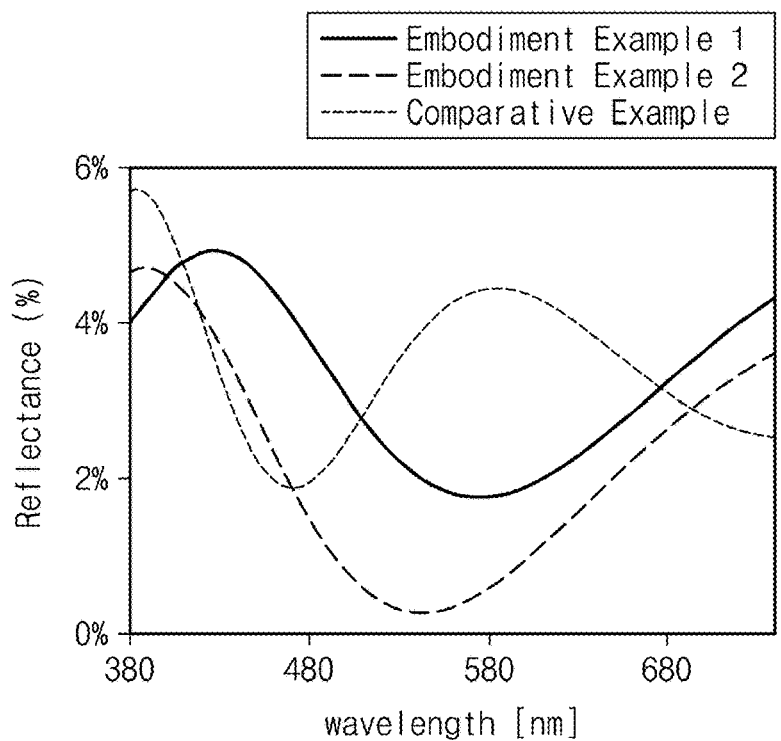
FIG. 10 is a graph showing reflectance according to wavelengths of Embodiments and Comparative Example.

FIG. 10 shows a graph of reflectance according to wavelengths of Embodiment Example 1, Embodiment Example 2, and Comparative Example. Embodiment Example 1 is a display device having the configuration of the embodiment of the display device DD shown in FIG. 4. Embodiment Example 2 is a display device having the configuration of the embodiment of the display device DD shown in FIG. 6. Comparative Example is a display device in the configuration of the display device DD of the embodiment shown in FIG. 4 as in Embodiment Example 1 but having an inorganic layer of a different thickness from Embodiment Example 1.

Embodiment Example 1 is a display device including a first light control layer LL1 and an inorganic layer IO and the thickness of the inorganic layer TO is about 3 kÅ. Embodiment Example 2 is a display device including a first light control layer LL1, a second light control layer LL2, and an inorganic layer IO, and the thickness of the inorganic layer IO is 3 kÅ, and the thickness of the second light control layer LL2 is about 1 kÅ. Comparative Example is a display device including a first light control layer LL1 and an inorganic layer IO and the thickness of the inorganic layer IO is about 4 kÅ.

Referring to FIG. 10, it can be seen that the graph trend of reflectance according to the wavelength of Comparative Example is different from the graph trend of reflectance according to the wavelength of Embodiment Example 1 and Embodiment Example 2. In Comparative Example, the shape of the graph is convex upward in the wavelength range of about 480 nm to about 680 nm, and Embodiment Example 1 and Embodiment Example 2 are convex downward in the wavelength range of about 480 nm to about 680 nm. That is, Embodiment Example 1 and Embodiment Example 2 show a tendency in which reflectance decreases compared to Comparative Example in the wavelength range of about 480 nm to about 680 nm.

This tendency may be a result of the difference in the thickness of the inorganic layer IO. The inorganic layer IO may have different tendencies to increase and decrease light reflectance according to wavelength depending on the thickness. Therefore, the wavelength range in which the reflectance decreases may vary. Since the thickness of the inorganic layer IO in Embodiment Example 1 and Embodiment Example 2 is about 3 kÅ but the thickness of the inorganic layer IO in Comparative Example is about 4 kÅ, it can be seen that the trend of the graph appears differently.

When the thickness of the inorganic layer IO is in a range of about 2.5 kÅ to about 3.5 kÅ, it can be seen that the reflectance in the wavelength range of about 500 nm to about 680 nm is particularly low in the wavelength range of the visible light region.

In addition, when Embodiment Example 1 and Embodiment Example 2 are compared, it can be seen that Embodiment Example 2 has a greater reduction in reflectance. This is because as the second light control layer LL2 is further included, the refractive index difference between each layer of the wavelength control layer WCL, the inorganic layer IO, the first light control layer LL1, the second light control layer LL2, and the color filter layer CFL sequentially stacked decreases, so that the degree of reflection of external light at the interface of each layer is reduced.

The thickness of the inorganic layer IO and the second light control layer LL2 may affect the phase of transmitted or reflected light. Depending on the phase of the light, constructive interference may occur or destructive interference may occur. Through the destructive interference effect, external light reflectance may be reduced. In Embodiment Example 2, the thickness of the inorganic layer IO is about 3 kÅ and the thickness of the second light control layer LL2 is about 1 kÅ. Therefore, it can be seen that by adjusting the thickness of the inorganic layer IO and the thickness of the second light control layer LL2, the effect of destructive interference can be maximized and this can reduce the external light reflectance.

Table 1 below is a table comparing the reflectance of each pixel area of the Comparative Example and Embodiment Example 2 and the total reflectance of the display device. "Reflectance of each pixel area" is a measured value of reflectance in each pixel area of Comparative Example and Embodiment Example 2. The "total reflectance" is a value that predicts the total reflectance of the display device through the reflectance of each pixel area. In Table 1, the first pixel area is an area that provides red light, the second pixel area is an area that provides green light, and the third pixel area is an area that provides blue light.

TABLE 1

| classification | First pixel area | Second pixel area | Third pixel area | Total reflectance |
| --- | --- | --- | --- | --- |
| Comparative Example | 0.33% | 0.43% | 0.38% | 1.35% |
| Embodiment Example 2 | 0.30% | 0.38% | 0.17% | 1.08% |

As shown in Table 1, in all pixel areas, the reflectance of Embodiment Example 2 was reduced than that of Comparative Example. The degree of reduction in reflectance in each pixel area decreased by 0.03% in the first pixel area, decreased by 0.05% in the second pixel area, and decreased by 0.21% in the third pixel area. As shown in Table 1, the total reflectance prediction result is 1.35% for Comparative Example and is 1.08% for Embodiment Example 2, and the total reflectance of Embodiment Example 2 may be reduced by about 0.27% compared to Comparative Example.

As shown in Table 1, the external light reflectance of each pixel area of the display device is reduced by the thickness of the inorganic layer, the refractive index matching between the stacked structures on the wavelength control layer of the display device, and the destructive interference effect. It can be understood that the total external light reflectance of the display device is reduced by reducing the external light reflectance corresponding to each pixel area. Accordingly, an embodiment of a display device including a light control member according to an embodiment of the invention may improve external light visibility and reliability of a display device.

In embodiments of the display device, the inorganic layer and light control layers included in the light control member have a specific range of refractive indexes or thicknesses so that refractive index matching effect and destructive interference effect may occur. Accordingly, in such an embodiment, the external light visibility of the display device may be improved by reducing the external light reflectance of the display device in which color filters are omitted in some areas. In such an embodiment, some operations of the process of disposing the color filter on the display device may be omitted, so that the display device may be manufactured relatively simply and economically.

In such embodiments, the display device has an effect of reducing external light reflectance and improving reliability.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a display panel;
   a wavelength control layer disposed on the display panel;
   a light control member disposed on the wavelength control layer; and
   a cover layer disposed on the light control member,
   wherein the light control member comprises:
     an inorganic layer disposed on the wavelength control layer and having a first refractive index;

a first light control layer disposed on the inorganic layer and having a second refractive index;
a second light control layer disposed on the first light control layer and having a third refractive index; and
a color filter layer disposed on the second light control layer,
wherein the first refractive index is greater than the second refractive index and is less than a refractive index of the wavelength control layer,
wherein the third refractive index is greater than the second refractive index and is less than a refractive index of the color filter layer.

2. The display device of claim 1, wherein each of the first refractive index and the third refractive index is in a range of about 1.4 to about 1.5.

3. The display device of claim 1, wherein a thickness of the inorganic layer is in a range of about 2.5 kÅ to about 3.5 kÅ.

4. The display device of claim 1, wherein a thickness of the second light control layer is in a range of about 0.5 kÅ to about 1.5 kÅ and about 2.5 kÅ to about 3.5 kÅ.

5. The display device of claim 1, wherein the second light control layer comprises an inorganic film or an organic film.

6. The display device of claim 5, wherein the second light control layer comprises an optically transparent organic film.

7. The display device of claim 5, wherein the second light control layer comprises an organic film, in which a light transmittance in a yellow light wavelength range is less than a light transmittance in a blue light wavelength range.

8. The display device of claim 1, wherein the second refractive index is about 1.3 or less.

9. The display device of claim 1, wherein
the display panel includes a pixel area and a peripheral area adjacent to the pixel area, and
the display panel comprises a light emitting element which generates first light and is disposed in the pixel area,
wherein the wavelength control layer comprises:
a partition part in which a plurality of opening parts are defined;
a first wavelength control unit disposed on one of the opening parts, wherein the first wavelength control unit converts the first light into a second light; and
a second wavelength control unit disposed on another of the opening parts, wherein the second wavelength control unit converts the first light to a third light,
wherein the color filter layer comprises:
a first color filter part overlapping the first wavelength control unit, wherein the first color filter part transmits the second light; and
a second color filter part overlapping the second wavelength control unit, wherein the second color filter part transmits the third light.

10. The display device of claim 9, wherein a portion of the first color filter part and a portion of the second color filter part overlap the partition part.

11. The display device of claim 9, wherein
the wavelength control layer further comprises a transmission part disposed in an opening part, in which the first wavelength control unit and the second wavelength control unit are not disposed among the opening parts, wherein the transmission part transmits the first light.

12. The display device of claim 11,
wherein the second light control layer overlaps the transmission part,
wherein a portion of the second light control layer overlapping the transmission part directly contacts the cover layer.

13. The display device of claim 11,
wherein the first wavelength control unit and the second wavelength control unit comprise a quantum dot,
wherein the transmission part comprises a scatterer.

14. The display device of claim 13, wherein the transmission part further comprises a colorant which transmits the first light and absorbs the second light and the third light.

15. The display device of claim 11, wherein a thickness of the transmission part is greater than a thickness of the first wavelength control unit and a thickness of the second wavelength control unit.

16. The display device of claim 9, wherein the light emitting element is an organic light emitting diode element, a micro light emitting diode element or a nano light emitting diode element.

17. A display device comprising:
a light emitting element layer which outputs a first light;
a wavelength control layer disposed on the light emitting element layer; and
a light control member disposed on the wavelength control layer,
wherein the light control member comprises:
an inorganic layer disposed on the wavelength control layer;
a first light control layer disposed on the inorganic layer; and
a color filter layer disposed on the first light control layer,
wherein a thickness of the inorganic layer is in a range of about 2.5 kÅ to about 3.5 kÅ.

18. The display device of claim 17,
wherein the light control member further comprises a second light control layer between the first light control layer and the color filter layer,
wherein each of a refractive index of the inorganic layer and a refractive index of the second light control layer is in a range of about 1.4 to about 1.5.

19. The display device of claim 18, wherein a thickness of the second light control layer is in a range of about 0.5 kÅ to about 1.5 kÅ and about 2.5 kÅ to about 3.5 kÅ.

20. The display device of claim 17, wherein the wavelength control layer comprises:
a first wavelength control unit including a first quantum dot which converts the first light into red light;
a second wavelength control unit including a second quantum dot which converts the first light into green light; and
a transmission part including a blue colorant and a scatterer,
wherein the color filter layer comprises:
a first color filter part overlapping the first wavelength control unit, wherein the first color filter part transmits the red light; and
a second color filter part overlapping the second wavelength control unit, wherein the second color filter part transmits the green light.

* * * * *